(12) United States Patent
Meade

(10) Patent No.: US 10,215,921 B2
(45) Date of Patent: Feb. 26, 2019

(54) METHOD AND STRUCTURE PROVIDING OPTICAL ISOLATION OF A WAVEGUIDE ON A SILICON-ON-INSULATOR SUBSTRATE

(71) Applicant: Micron Technology, Inc., Boise, ID (US)

(72) Inventor: Roy E. Meade, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/648,326

(22) Filed: Jul. 12, 2017

(65) Prior Publication Data

US 2017/0315295 A1    Nov. 2, 2017

Related U.S. Application Data

(62) Division of application No. 13/487,573, filed on Jun. 4, 2012, now Pat. No. 9,709,740.

(51) Int. Cl.
| | |
|---|---|
| *G02B 6/122* | (2006.01) |
| *G02B 6/136* | (2006.01) |
| *H01L 21/762* | (2006.01) |
| *H01L 21/84* | (2006.01) |
| *G02B 6/12* | (2006.01) |

(52) U.S. Cl.
CPC ............ *G02B 6/136* (2013.01); *G02B 6/122* (2013.01); *H01L 21/76283* (2013.01); *G02B 2006/12061* (2013.01); *H01L 21/84* (2013.01)

(58) Field of Classification Search
CPC ....... G02B 6/12; G02B 6/1225; G02B 6/1226
See application file for complete search history.

(56) References Cited

U.S. PATENT DOCUMENTS

| | | | |
|---|---|---|---|
| 5,882,987 | A | 3/1999 | Srikrishnan |
| 6,562,127 | B1 | 5/2003 | Kud et al. |
| 6,603,559 | B2 | 8/2003 | Tsao et al. |
| 6,617,646 | B2 | 9/2003 | Parab et al. |
| 6,789,659 | B2 | 9/2004 | Spejna et al. |
| 6,789,959 | B1 | 9/2004 | Conn et al. |
| 6,897,498 | B2 | 5/2005 | Gothoskar et al. |
| 6,993,236 | B1 | 1/2006 | Gunn et al. |
| 7,071,531 | B2 | 7/2006 | Rhodes et al. |
| 7,285,433 | B2 | 10/2007 | Kretchmer et al. |
| 7,920,770 | B2 | 4/2011 | Holzwarth et al. |
| 7,927,979 | B2 | 4/2011 | Hill et al. |

(Continued)

FOREIGN PATENT DOCUMENTS

| | | |
|---|---|---|
| CN | 102033332 A | 4/2011 |
| EP | 1850160 A1 | 10/2007 |

(Continued)

OTHER PUBLICATIONS

Symmetric Dielectric Slab Waveguides, pp. 26-33.

(Continued)

*Primary Examiner* — Sung Pak
*Assistant Examiner* — Hoang Tran
(74) *Attorney, Agent, or Firm* — Perkins Coie LLP

(57) ABSTRACT

Disclosed are a method and structure providing a silicon-on-insulator substrate on which photonic devices are formed and in which a core material of a waveguide is optically decoupled from a support substrate by a shallow trench isolation region.

9 Claims, 5 Drawing Sheets

(56) References Cited

U.S. PATENT DOCUMENTS

| | | | |
|---|---|---|---|
| 2001/0041423 A1 | 11/2001 | Nishida et al. | |
| 2003/0015770 A1 | 1/2003 | Talin et al. | |
| 2004/0114853 A1 | 6/2004 | Bjorkman et al. | |
| 2007/0023799 A1 | 2/2007 | Boettiger et al. | |
| 2008/0050082 A1 | 2/2008 | Mitomi et al. | |
| 2008/0085075 A1 | 4/2008 | Kishima et al. | |
| 2009/0087137 A1* | 4/2009 | Doan | B82Y 20/00 385/14 |
| 2009/0297091 A1 | 12/2009 | Assefa et al. | |
| 2010/0129952 A1 | 5/2010 | Martinez et al. | |
| 2011/0108943 A1 | 5/2011 | Dennard et al. | |
| 2011/0133063 A1 | 6/2011 | Ji et al. | |
| 2012/0129302 A1 | 5/2012 | Assefa et al. | |
| 2012/0322177 A1* | 12/2012 | Pomerene | H01L 27/13 438/22 |
| 2013/0322811 A1 | 12/2013 | Meade | |

FOREIGN PATENT DOCUMENTS

| | | | |
|---|---|---|---|
| JP | 2000275472 A | 10/2000 | |
| JP | 2003517635 A | 5/2003 | |
| JP | 2004055752 A | 2/2004 | |
| JP | 2010185966 A | 8/2010 | |
| JP | 2011118399 A | 6/2011 | |
| TW | 201027736 A | 7/2010 | |
| WO | 2005096047 A1 | 10/2005 | |
| WO | 2011037686 A1 | 3/2011 | |
| WO | 2011109146 A2 | 9/2011 | |

OTHER PUBLICATIONS

Smith, B. Thomas et al., "Fundamentals of Silicon Photonic Devices," Kotura, Inc., 2630 Corporate Place, Monterey Park, CA 91754, USA, 2006.

W.P. Maszara, "Silicon-on-Insulator by Wafer Bonding: A Review," J. Electrochem. Soc,, vol. 138, No. 1, pp. 341-347, Jan. 1991.

Office Action dated Apr. 11, 2017 in Korea Application No. 10-2014-7036322, 6 pages.

Office Action dated Aug. 1, 2016 in China Application No. 201380035848.1, 13 pages.

Office Action dated Aug. 9, 2016 in Korea Application No. 10-2014-7036322, 12 pages.

Office Action dated Mar. 16, 2017 in China Application No. 201380035848.1, 15 pages.

Office Action dated Feb. 1, 2016 in Korea Applicn. 10-2014-7036322, 10 pages.

Office Action dated Feb. 21, 2017 in Japanese Application No. 2015-516072, 16 pages.

Office Action dated Jun. 21, 2016 in Japan Application No. 2015-516072, 20 pages.

Written Opinion dated Sep. 18, 2015 in Singapore Application No. 11201408258T, 7 pages.

JP Patent Application No. 2015-516072—Japanese Office Action and Search Report, dated Dec. 5, 2017, with English Translation, 5 pages.

EP Patent Application No. 13814270.8—European Office Action, dated Feb. 15, 2018, 6 pages.

* cited by examiner

METHOD AND STRUCTURE PROVIDING OPTICAL ISOLATION OF A WAVEGUIDE ON A SILICON-ON-INSULATOR SUBSTRATE

CROSS-REFERENCE TO RELATED APPLICATION

This Application is a divisional of U.S. application Ser. No. 13/487,573 filed Jun. 4, 2012, now U.S. Pat. No. 9,709,740, which is incorporated herein by reference in its entirety.

GOVERNMENT LICENSE RIGHTS

This invention was made with government support under Grant No. HR0011-9-0009 awarded by DARPA. The government has certain rights in this invention.

FIELD OF THE INVENTION

Various embodiments described herein relate to optically decoupling a waveguide from material contained in a substrate supporting it.

BACKGROUND OF THE INVENTION

There is a current trend to integrate photonic devices and electronic devices on the same substrate. A silicon-on-insulator (SOI) substrate can be used as the supporting substrate for such integration. When optical waveguides are formed a cladding is provided around the core of the waveguide for confining a light wave propagated along the waveguide. The core material has an index of refraction which is larger than that of the cladding. If silicon is used as the core material of a waveguide, having an index of refraction of about 3.47, the waveguide cladding can be formed of silicon dioxide which has an index of refraction of about 1.54. When a silicon-on-insulator substrate is used as the supporting substrate, the cladding material below the waveguide core can be the buried oxide (BOX) insulator of the SOI substrate, which is again typically silicon dioxide. The BOX cladding can also function to prevent optical signal leakage by evanescent coupling from the silicon waveguide core to a supporting silicon of the SOI structure. However, to prevent such evanescent coupling, the BOX cladding material beneath the waveguide core must be relatively thick, for example, greater than 1.0 μm and often 2.0 μm-3.0 μm thick. When the Box cladding material is thick it inhibits heat flow to the underlying silicon, which can act as a heat dissipator. In addition, when certain electronic devices, such as high speed logic circuits, are integrated on the same SOI substrate as photonic devices, the BOX of the SOI substrate must be relatively thin, typically having a thickness in the range of 100-200 nm. Such a thin BOX insulator, while providing a good substrate for the electronic devices, is insufficient to prevent optical coupling of the silicon waveguide core to the underlying supporting silicon of the SOI substrate, which causes undesirable optical signal loss.

One way to prevent evanescent coupling of a silicon waveguide core to supporting silicon of a substrate is discussed in U.S. Pat. No. 7,920,770. There, an etched cavity is formed in the silicon support material at an area below a buried insulator. The cavity serves to increase the distance between the waveguide core and the supporting silicon. The cavity may remain empty or be filled by a gas or other material having refractive properties which prevent the silicon waveguide core from easily optically coupling to the cavity material or silicon in which the cavity is formed. The cavity may be formed after a waveguide is formed by beginning an etch of the supporting silicon at an area outside the area of the waveguide core. The etch process produces a cavity in the supporting silicon which expands downwardly and outwardly of the etch location. This produces a large cavity which may encompass areas of the silicon substrate which are not below the waveguide and not needed for optical isolation. In addition, the cavity may be formed below photonic devices which are coupled to the waveguide such as an optical modulator connected to the waveguide. If the optical modulator or other photonic device coupled to the waveguide is operated in a manner which generates or requires the addition of heat during operation, the cavity and/or material within the cavity disrupts heat flow to the supporting silicon substrate material to lessen its effectiveness as a heat sink.

Accordingly, another method and structure for forming a silicon-on-insulator structure which has a relatively thin BOX insulator and which is capable of optically decoupling the waveguide core from the substrate material is desirable.

DETAILED DESCRIPTION OF THE INVENTION

In the following detailed description, reference is made to the accompanying drawings which form a part hereof, and in which is shown by way of illustration specific embodiments that may be practiced. These embodiments are described in sufficient detail to enable those skilled in the art to make and use them, and it is to be understood that structural, logical, or procedural changes may be made to the specific embodiments disclosed without departing from the spirit and scope of the invention.

Embodiments described herein provide a silicon on insulator (SOI) structure on which both photonic devices and electronic circuits can be formed with a sufficient optical decoupling of the core of a waveguide from a first support substrate to prevent optical loss by evanescent coupling, while retaining good heat dissipation Optical decoupling is provided by a shallow trench isolation area formed in the first substrate which is beneath and extends along the waveguide core. When the first substrate is joined with a second substrate having a BOX insulator and silicon on which the waveguide and electric circuits will be formed, the shallow trench isolation is aligned at an area below where a waveguide will be formed in the second substrate. Accordingly, a silicon-on-insulator (SOI) structure can be formed with a thin BOX, with the optical isolation structure more targeted to the areas where needed, while providing a supporting first substrate which is better able to dissipate heat.

Figure 1:
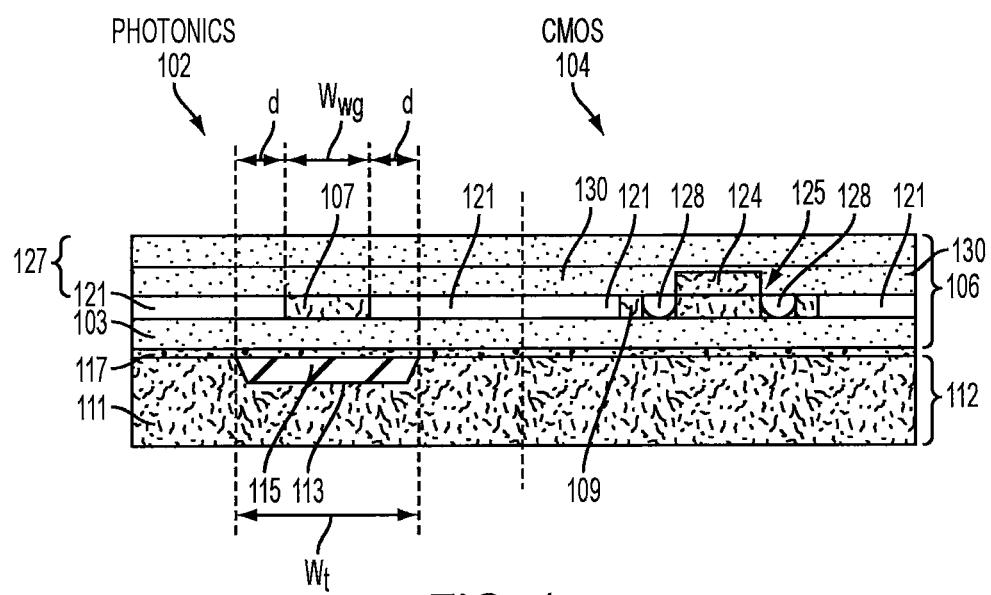
FIG. 1 depicts in cross section an embodiment of an SOI structure formed in accordance with the invention.
Figure 4A:
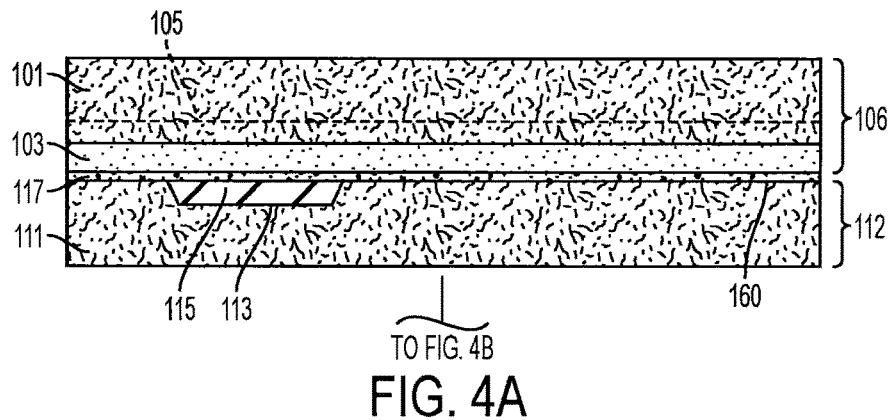
FIGS. 4A through 4E depict in successive cross sectional views a process for forming the FIG. 1 embodiment.
Figure 4B:
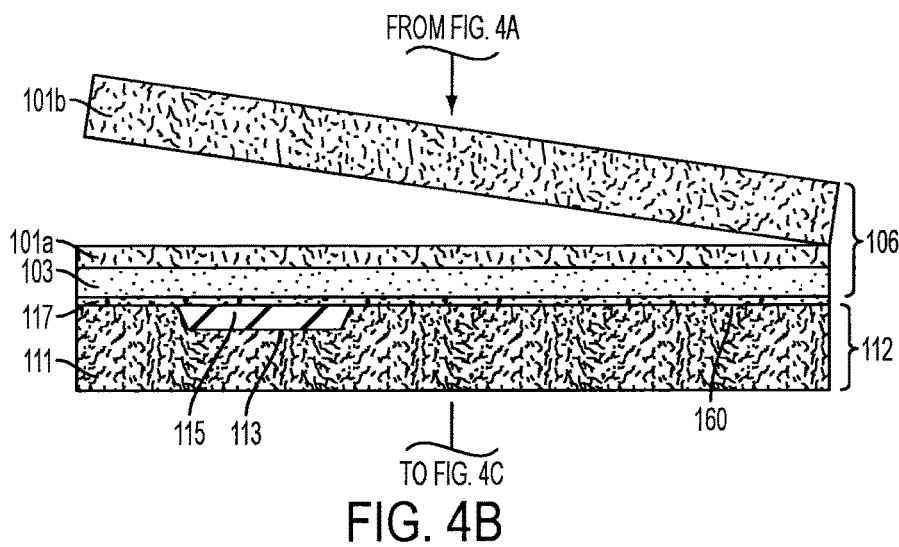

FIG. 1 illustrates an embodiment of a silicon-on-insulator structure which includes a first substrate which is part of a handle wafer 112 formed of support semiconductor material, for example support silicon 111, joined to a second substrate which is part of a body wafer 106. The body wafer 106 contains a silicon area 101a (FIG. 4B) over a buried oxide BOX layer 103. The silicon area 101a is shown in FIG. 1 as divided into a silicon photonics area 102 where a silicon waveguide core 107 and other photonic devices can be formed and a silicon CMOS area 104 where electronic circuits can be formed such as a MOSFET transistor 125. The handle wafer 112 includes a shallow trench isolation (STI) region which includes a trench 113 formed in support silicon 111 which is filled with dielectric material 115. The shallow trench isolation is sufficient to prevent optical coupling between the silicon waveguide core 107, formed on body wafer 106 and the support silicon 111 in the handle wafer 112.

The filled trench 113 has a thickness such that the thickness of BOX 103 and thickness of the filled trench are at least 1000 nm. As an example, if the BOX 103 thickness is 200 nm, the trench 113 thickness is greater than 800 nm, for example in the range of about 800 nm to about 1200 nm. The filled trench has a width $W_t$ which is wider than the width $W_{wg}$ of waveguide core 107 such that the trench extends beyond either side of the waveguide core 107 by the distance d of at least 1 micron, and typically in the range of 1 to 1.3 microns. The filled trench 113 extends below and along the length of waveguide core 107.

The waveguide core 107, formed of silicon, is surrounded by a cladding having a much lower refractive index than the silicon core. The cladding is in part formed by the buried oxide BOX 103, which can be made thin, for example, 200 nm or less. The thin BOX 103, by itself, is incapable of providing a sufficient optical decoupling of a silicon waveguide core 107 from the support silicon 111 of the handle wafer. As shown in FIG. 1, the trench 113 of the shallow trench isolation region is aligned below the silicon waveguide core 107 and provides the required optical decoupling of the waveguide core 107 from the support silicon 111 of the handle wafer 112. The cladding around the waveguide core 107 is provided by the underlying BOX 103, a dielectric 121 provided on the sides of the waveguide core 107, and a dielectric 130 provided as a lower layer and part of an inter layer dielectric structure 127. A material which can be used for BOX 103, dielectric 121 and dielectric 130 in the interlayer dielectric structure 127 is silicon dioxide, although other dielectric materials having an index of refraction lower than that of silicon could also be used.

FIG. 1 illustrates a CMOS circuit area 104 as having circuit areas 109 containing electronic devices, represented by a MOSFET 125, having a gate structure 124 and source and drain regions 128 formed therein. FIG. 1 also illustrates an amorphous silicon bonding material 117 which may be provided to bond the handle wafer 112 to the body wafer 106 containing the waveguide core 107 and electronic circuitry 109 areas. This bonding material 117 may be omitted, if there is otherwise sufficient bonding strength between of the handle wafer 112 and the body wafer 106 containing the waveguide core 107 and electronic circuitry 109 areas, as described in greater detail below. If the amorphous silicon bonding material 117 is provided it can change from amorphous to crystalline form during later CMOS processing for electronic current formation.

Figure 2A:
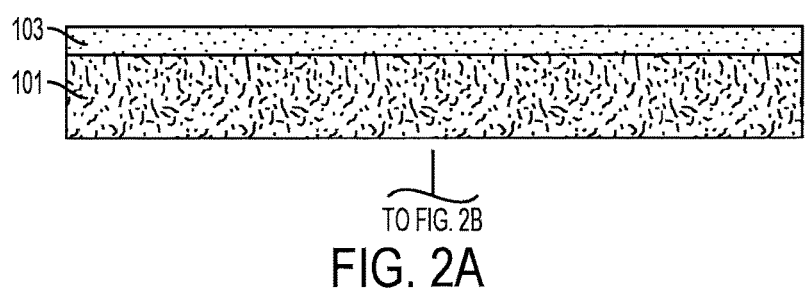
FIGS. 2A and 2B depict in successive cross sectional views a process for forming a body wafer used in the FIG. 1 structure.
Figure 2B:
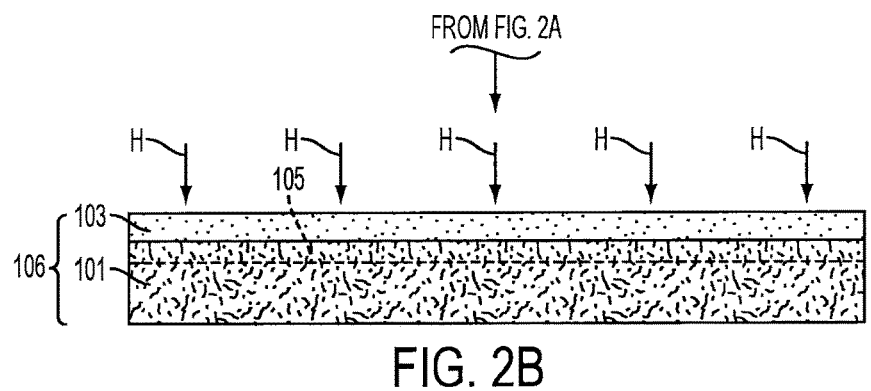
Figure 3A:
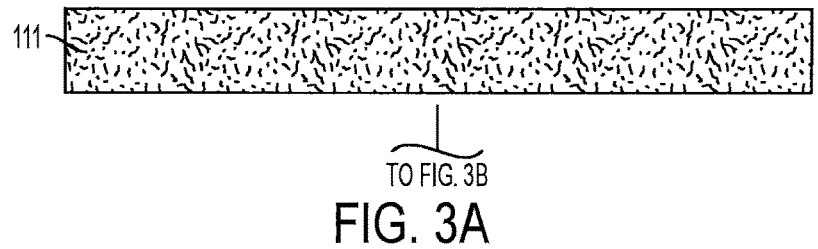
FIGS. 3A through 3D depict in successive cross section views a process for forming a handle wafer used in the FIG. 1 structure.
Figure 3B:
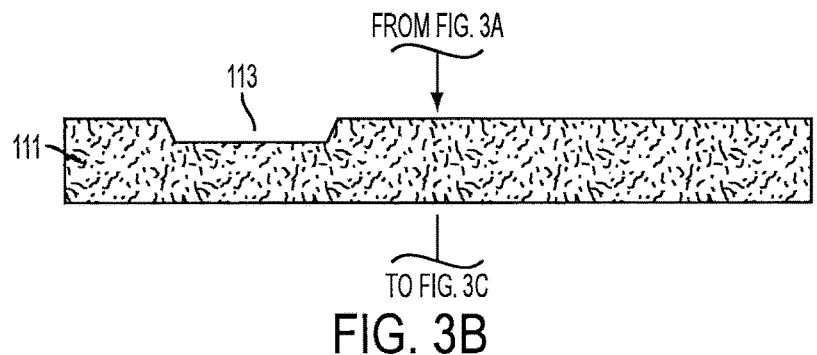
Figure 3C:
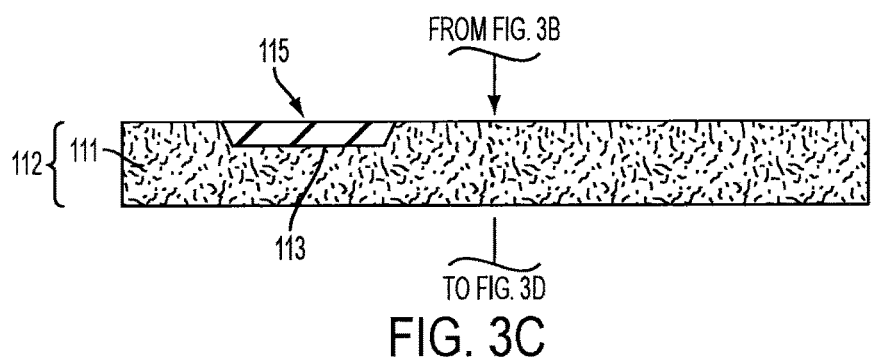
Figure 3D:
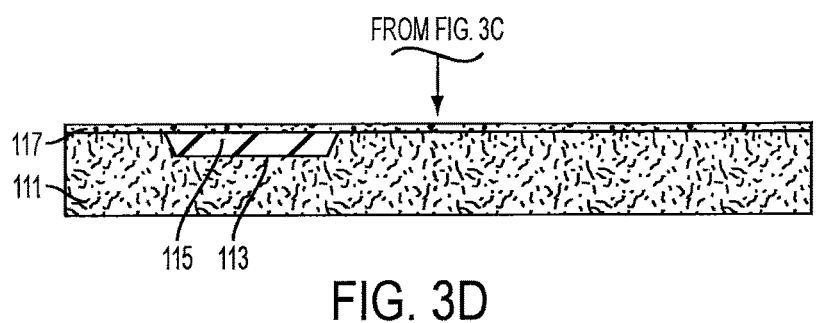

FIGS. 2-4 show various stages in an example method of manufacturing the structure shown in FIG. 1. FIGS. 2A-2B illustrate an example process of forming body wafer 106, while FIGS. 3A-3D illustrate an example process of forming handle wafer 112.

FIG. 2A shows the formation of an oxide material 103, for example SiO2, which will form the buried oxide (BOX) 103 layer in a completed silicon-on insulator structure. Hydrogen atoms are implanted into the body wafer 106 to form a cleavage line 105 (FIG. 2B) discussed in more detail below.

Referring now to FIGS. 3A-3D, a process for forming handle wafer 112 is described. A semiconductor, e.g., support silicon 111 (FIG. 3A), has a shallow trench 113 formed therein (FIG. 3B) at locations which will underlie a waveguide core 107 in the completed structure shown in FIG. 1. The trench is formed by etching through a mask, followed by a dielectric material 115 fill (FIG. 3C) which is then planarized by, for example, a CMP process to form a completed support handle 112. The trench can be formed to a depth sufficient that when the trench is filled with dielectric material and planarized, a waveguide core 107 is optically decoupled from the support silicon 111, of handle wafer 112 (FIG. 1). As one example, for a waveguide core 107 having a width of 300 nm and a height of 200 nm, the surrounding cladding thickness should be 1 um or greater. Thus, the combined thickness of the BOX layer 103 and dielectric within the shallow trench should be at least 1 um. If the BOX layer 103 is, for example 200 nm thick, then the trench 113 thickness should be at least 800 nm. As noted, an example working range for this thickness is about 800 nm to about 1200 nm. The trench can be filled with a material having an index of refraction lower from that of core material 107 to reduce evanescent coupling of silicon core material 107 to the support silicon 111 of the handle wafer 112. The dielectric material 115 filling the trench can be silicon dioxide. Other dielectric materials which can form the BOX 103, dielectric 121 and also fill the trench 113 include silicon nitride (refractive index 2.01), and TEOS (refractive index 1.44-1.46) or a vacuum. The dielectric material 115 can be deposited by a high density plasma vapor deposition or a plasma enhanced chemical vapor deposition, as examples.

A thin bonding material 117, e.g., amorphous silicon, can be applied to the handle wafer 112 to facilitate its bonding to the body wafer 106. Alternatively, the bonding material 117 can be formed of silicon dioxide, which can bond with the BOX layer 103 on the body wafer 106. Other know interface materials for bonding two wafers together can also be used. As another alternative, bonding material 117 can be omitted if sufficient temperature and pressure are used during the bonding process. If a bonding material 117 of amorphous silicon is used, it must be sufficiently thin to avoid evanescent coupling of optical signals in the waveguide core 107 to this layer. If a single mode optical signal wavelength is propagated in waveguide core 107, which have wavelengths in the range of about 1.2 um to about 1.55 um, a thickness of less than 30E-9m is sufficient to prevent optical coupling to the amorphous silicon bonding material 117. If provided, bonding material 117 can, as an alternative, be applied to the BOX layer 103 of the body wafer 106, or to both the BOX layer 103 of the body wafer 106 as well as to the handle wafer 112.

FIGS. 4A to 4E illustrate the process to form a silicon-on-insulator substrate by bonding the body wafer 106 to the handle wafer 112. The body wafer 106 is flipped over and the BOX layer 103 is attached to the upper surface 160 of the handle wafer 112 which contains the dielectric filled trench 113. Conventional wafer aligning techniques can be used to align the body wafer 106 and handle wafer 112 before bonding them together. As noted, a bonding layer 117 can be used to facilitate bonding, but may be omitted if bonding conditions are otherwise sufficient to form a good bond between the body wafer 106 and upper surface 160 of the handle wafer 112. Other wafer bonding techniques and materials know in the art can also be used.

Figure 4C:
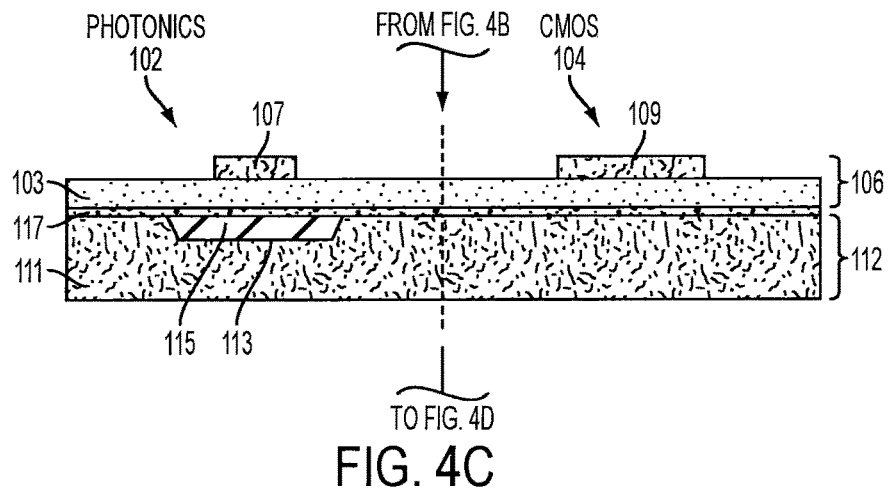

After the body wafer 106 is bonded to the handle wafer 112, a portion 101*b* (FIG. 4B) of the semiconductor 101 along the hydrogen implanted cleave line 105 can be removed by a known cleaving process, thus leaving a thinner semiconductor material 101*a* for device formation. The removed wafer portion 101*b* of body wafer 106 can then be recycled and used as a body wafer 106 for constructing another SOI substrate. As an alternative to the cleaving process described, the semiconductor 101 need not have the hydrogen implant to the cleave line 105 shown in FIG. 2B; instead the semiconductor 101 in the body wafer 106 can be thinned by other conventional processes, such as CMP or grinding. The semiconductor 101*a* can be patterned into an area for formation of photonic devices, including a waveguide core 107 which is positioned over and aligned with the STI trench 113 in the handle wafer 112. The semiconductor 101 a can also be patterned to provide one or more areas 109 for the construction of electronic circuit devices, such as MOSFET transistors 125 and other electronic devices. Thus, as shown in FIG. 4C, the silicon-on-insulator structure can be divided into areas, as shown by dotted lines, into the photonics area 102 and the electronic circuit area 104, with the STI trench 113 provided below the waveguide core 107.

Figure 4D:
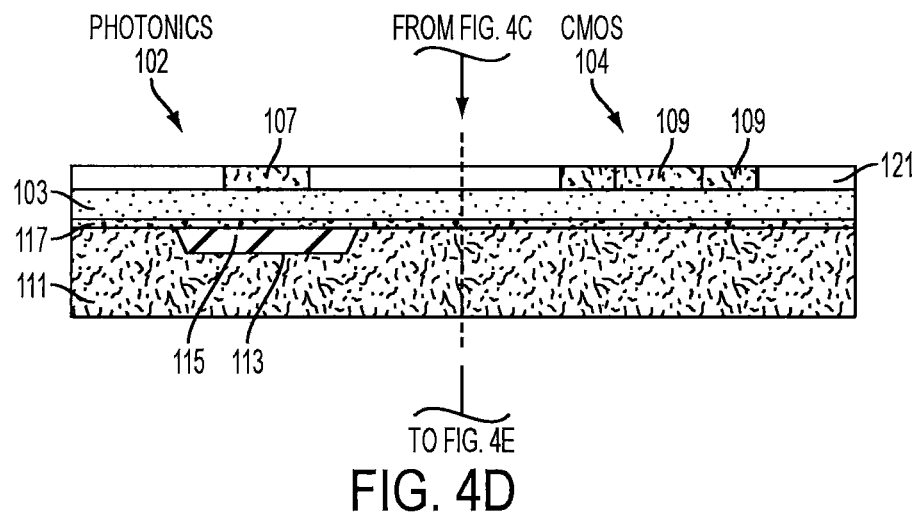
Figure 4E:
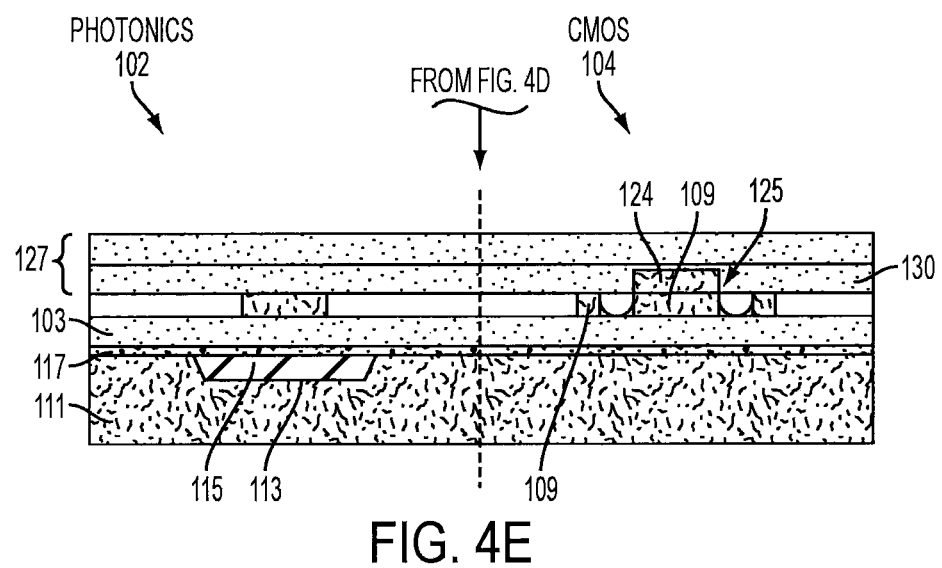

As further shown in FIG. 4D, a dielectric material 121, e.g. silicon dioxide, is then applied and planarized such that the silicon waveguide core 107 is surrounded on three sides by cladding material, e.g. silicon dioxide, which includes BOX 103 and dielectric material 121. Further processing can then be conducted to form the waveguide 107 and photonic devices associated with the waveguide 107, and electronic devices in the electronic circuits area 109. As shown in FIGS. 1 and 4E, MOSFET 125 having a gate structure 124 and source/drain regions 128 is shown as being representative of electronic circuits and devices which can be fabricated in area 109. After the photonic devices, including waveguide core 107 and electronic circuits 125 are constructed, and as further shown in FIG. 4E, the silicon-on-insulation substrate is covered with a first dielectric 130 of a multilayer interlayer dielectric (ILD) structure 127. This first dielectric 130 of the ILD structure 127 may also be formed of e.g., silicon dioxide, or other dielectric material which acts as an upper cladding for waveguide core 107. Various electrical interconnections are then made to devices associated with the waveguide 107 and to the electronic circuits through several metallization and dielectric layers of interlayer dielectric structure 127.

While various embodiments have been described herein, the invention is not limited by those embodiments as various modifications can be made without departing from the spirit or scope of the invention. Accordingly, the invention is not limited by the disclosed embodiments, but is only limited by the scope of the appended claims.

What is claimed as new and desired to be protected by Letters Patent of the United States is:

1. An integrated structure comprising:
   a first semiconductor substrate having a shallow trench isolation region formed therein, the trench of the isolation region being filled with a dielectric material having a first index of refraction, wherein the dielectric material comprises silicon dioxide; and
   a second substrate attached to the first substrate and including a dielectric material facing the first substrate and a waveguide formed of a semiconductor material over the dielectric material, the waveguide being formed of a material having a second index of refraction greater than the first index of refraction and being located over the shallow trench isolation region.

2. A structure as in claim 1, wherein the combined thickness of the dielectric material facing the second substrate and the shallow trench isolation region is at least 1000 nm.

3. A structure as in claim 1, wherein the first and second substrates comprise silicon.

4. A structure as in claim 1, wherein the waveguide comprises a core region surrounded by a cladding region, the cladding region being formed at least in part by the dielectric material on the second substrate.

5. A structure as in claim 1, wherein the core region comprises silicon and the cladding region comprises silicon dioxide.

6. A structure as in claim 1, further comprising an area of the semiconductor material of the second substrate on which an electronic circuit element is formed.

7. A structure as in claim 1, wherein the attached first and second substrates form a silicon-on-insulator structure.

8. A structure as in claim 1, further comprising a dielectric material over the semiconductor material of the second substrate.

9. A structure as in claim 8, wherein the dielectric material over the semiconductor material of the second substrate is part of an interlayer dielectric structure.

* * * * *